United States Patent [19]

Wolfram

[11] Patent Number: 4,691,291
[45] Date of Patent: Sep. 1, 1987

[54] RANDOM SEQUENCE GENERATORS

[75] Inventor: Stephen Wolfram, Cambridge, Mass.

[73] Assignee: Thinking Machines Corporation, Cambridge, Mass.

[21] Appl. No.: 779,121

[22] Filed: Sep. 23, 1985

[51] Int. Cl.[4] ............................................. G06F 1/02
[52] U.S. Cl. ..................................................... 364/717
[58] Field of Search ................... 364/717; 178/22.01, 178/22.05, 22.09, 22.1, 22.11, 22.13, 22.19; 380/37, 49, 28, 29, 43, 50, 46

[56] References Cited

U.S. PATENT DOCUMENTS

| | | | |
|---|---|---|---|
| 3,548,174 | 12/1970 | Knuth | 364/717 |
| 4,161,041 | 7/1979 | Butler et al. | 365/244 |
| 4,183,088 | 1/1980 | Simmons | 364/717 |
| 4,234,932 | 11/1980 | Gorgens | 364/900 |
| 4,355,366 | 10/1982 | Porter | 364/717 |
| 4,438,501 | 3/1984 | Weber | 364/717 |
| 4,493,046 | 1/1985 | Watanabe | 364/717 |
| 4,511,988 | 4/1985 | Michel et al. | 364/717 |

OTHER PUBLICATIONS

Wolfram, Stephen, "Computer Software in Science and Mathematics", *Scientific American*, Sep. 1984, vol. 251, No. 3, pp. 188-203.

Wolfram, Stephen, "Twenty Problems in the Theory of Cellular Automata", *Physica Scripta*, vol. T9, pp. 170-183.

*Primary Examiner*—Archie E. Williams, Jr.
*Assistant Examiner*—Dale M. Shaw
*Attorney, Agent, or Firm*—Spencer & Frank

[57] ABSTRACT

A random sequence generator includes a plurality of successive stages in a closed loop wherein each of the stages includes a logic circuit and an input-output circuit, the input-output circuit having an input coupled to the output of the logic circuit. The logic circuit, which has n inputs, functions as a storage element or look-up table having $2^n$ addresses. Connection circuitry is provided for connecting one of the inputs of the logic circuit to the output of the input-output circuit of the same stage. Each of the remaining $n-1$ inputs of the logic circuit is connected to the output of the input-output circuit of a corresponding one of the other stages. An output signal having a plurality of sequential random values is generated at the output of each of the input-output circuits in response to an initial key signal applied to inputs of the input-output circuit.

11 Claims, 15 Drawing Figures

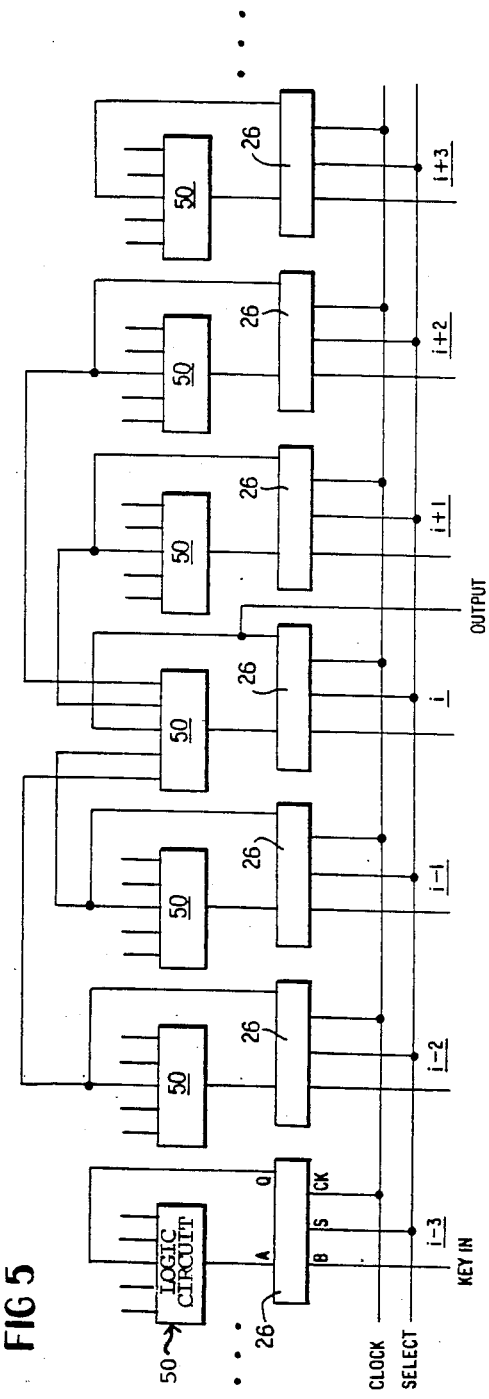

| Clock Pulse | Stage i-1 | Stage i | Stage i+1 | Stage i+2 | |
|---|---|---|---|---|---|
| 1 | 0 | 1 | 0 | 0 | FIG. 3a |
| 2 | 1 | 1 | 1 | 0 | FIG. 3b |
| 3 | 1 | 0 | 0 | 0 | FIG. 3c |
| 4 | 1 | 1 | 0 | 1 | FIG. 3d |
| 5 | 0 | 0 | 0 | 1 | FIG. 3e |
| 6 | 1 | 0 | 1 | 1 | FIG. 3f |
| 7 | 0 | 0 | 1 | 0 | FIG. 3g |
| 8 | 0 | 1 | 1 | 1 | FIG. 3h |
| 9 | 0 | 1 | 0 | 0 | FIG. 3i |
| 10 | 1 | 1 | 1 | 0 | FIG. 3j |
| 11 | 1 | 0 | 0 | 0 | FIG. 3k |

RANDOM SEQUENCE GENERATORS

BACKGROUND OF THE INVENTION

This invention relates to random sequence generators and in particular to a one-dimensional cellular automaton for generating random sequence signals.

Sequences that seem random are needed for a wide variety of purposes. They are used for unbiased sampling in the Monte Carlo method, and to imitate stochastic natural processes. They are used in implementing randomized algorithms on digital computers, and their unpredictability is used in games of chance. Random sequence generators are used as repeatable noise sources for electronic testing purposes.

To generate a random sequence on a digital computer, one starts with a fixed length seed, then iteratively applies some transformation to it, progressively extracting a random sequence which is as long as possible. In general, a sequence is considered "random" if no patterns can be recognized in it, no predictions can be made about it, and no simple description of it can be found. However, even if the sequence can be generated by iteration of a definite transformation it can nevertheless seem random if no computations done on it reveal this simple description. The original seed must be transformed in such a complicated way that the computations cannot recover it.

The fact that acceptably random sequences can be generated efficiently by digital computers is a consequence of the fact that quite simple transformations, when iterated, can yield extremely complicated behavior. Simple computations are able to produce sequences whose origins can apparently be deduced only by much more complex computations.

Most current practical random sequence generation computer programs are based on linear congruence relations (of the form $x' = ax + b \mod n$), or linear feedback shift registers of the type discussed in "Shift Register Sequences", S. W. Golomb, Holden-Day (1967). The linearity and simplicity of these systems has made complete algebraic analysis possible, and has allowed certain randomness properties to be proved. But these characteristics also lead to efficient algebraic algorithms for predicting the sequences (or deducing their seeds), and limits their degree of randomness.

There are many standard mathematical processes which are simple to perform, yet produce sequences so complicated that they seem random. An example is taking square roots of integers. Many physical processes also yield seemingly random behavior and, in some cases, the randomness can be attributed to the effects of an external random input. Thus for example "analog" random sequence generators such as noise diodes work by sampling thermal fluctuations associated with a heat bath containing many components. Coin tossings and Roulette wheels produce outcomes that depend sensitively on initial velocities determined by complex systems with many components. It seems however that in all such cases, sequences extracted sufficiently quickly can depend on only a few components of the environment, and must eventually show definite correlations.

I have found that randomness in many physical systems may not arise from external random inputs, but rather through intrinsic mathematical processes. This invention makes use of such a process employing a one-dimensional cellular automaton.

SUMMARY OF THE INVENTION

A one-dimensional cellular automaton consists of a line of sites with values $a_i$ between 0 and $k-1$. These values are updated synchronously in discrete time steps according to a fixed rule of the form $$a_i' = \phi(a_{i-r}, a_{i-r+1}, \ldots, a_{i+r}) \qquad (1),$$

where $a_i'$ is the value of $a_i$ after each updating.

A random sequence generator employing this rule may be implemented by connecting a plurality of successive stages in a closed loop wherein each of the stages comprises a logic circuit and an input-output circuit, the input-output circuit having an input coupled to the output of the logic circuit. The logic circuit, which has n inputs, functions as a storage element or look-up table having $2^n$ addresses. It generates a 0 or a 1 at its output depending upon the signal applied to its n inputs.

Connection means are provided for connecting one of the inputs of the logic circuit to the output of the input-output circuit of the same stage. Each of the remaining $n-1$ inputs of the logic circuit is connected to the output of the input-output circuit of a corresponding one of the other stages. An output signal having a plurality of sequential random values is generated at the output of each of the input-output circuits in response to an initial key signal applied to inputs of the input-output circuit.

A preferred form of the invention employs a cellular automation wherein $k=2$ and $r=1$. There are a total of 256 cellular automaton rules that depend on three sites, each with these two possible values, $k=2$, $r=1$. In one form of the random sequence generator I have invented, rule (1) reduces to the nonlinear rule, $$a_i' = a_{i-1} \text{XOR} (a_i \text{ OR } a_{i+1}) \qquad (2),$$

where XOR stands for exclusive junction (addition modulo two) and OR for inclusive disjunction (Boolean addition).

Random sequences are obtained from rule (2) by sampling the values that a particular site attains as a function of time. In a practical implementation, a finite number of sites are arranged in a circular register in which each site is represented by a stage of the register. Given almost any initial "seed" configuration for the sites in the register, a long and random sequence can be obtained.

More specifically, a preferred form of the random sequence generator comprises a register consisting of a plurality of stages (corresponding to the sites of the cellular automaton) each of which includes an OR gate and an exclusive OR gate (hereinafter XOR). If the successive stages of the random signal generator are designated . . . $i-2$, $i-1$, $i$, $i+1$, $i+2$ . . . , the new output $a_i'$ from the i stage is obtained by OR'ing the previous outputs $a_i$ and $a_{i+1}$ of the i and $i+1$ stages respectively, and then XOR'ing the OR'd output with the output of the $i-1$ stage.

A circuit configuration for the preferred form of the random signal generator comprises a plurality of successive stages arranged in a closed loop each of which includes an OR gate, an XOR gate having a second input connected to the output of the OR gate, and an input-output circuit. Means are provided for connecting the output of each of the input-output circuits to a first input of the OR gate of the same stage (i), a second input of the OR gate of the previous stage (i−1) and to a first input of the XOR gate of the succeeding stage (i+1).

The output of each XOR gate is applied to a first input of the input-output circuit of the same stage, an initial key input signal is applied to the second inputs of the input-output circuits, and a stream of clock pulses is applied to clock inputs of each of the input-output circuits. The signal applied to the second input of each input-output circuit is either a 0 or a 1 selected to conform to a predetermined pattern for the key signal.

In response to the key signal, each of the stages assumes either a 0 or 1 state, and on the next clock pulse the output $a_i'$ of the i stage will be either a 0 or 1 depending upon the state of the i, i−1 and i+1 stage during the previous clock pulse. On succeeding clock pulses, the output $a_i'$ will vary with a high degree of randomness depending on the number N of successive stages.

Another embodiment of the invention employs the rule, $$a_i' = a_{a-1} \text{XOR} (a_1 \text{ OR (NOT } a_{i+1})), \quad (3),$$

where NOT stands for negation. This rule is implemented by the circuit configuration described above, except that the second input to each OR gate is inverted.

BRIEF DESCRIPTION OF THE DRAWINGS

FIG. 2 shows schematically the input-output circuit of FIG. 2.

FIG. 3 comprising of FIG. 3a–FIG. 3k, is a diagram showing the outputs of the circuit of FIG. 1 for a specific key input signal.

FIG. 4 is a schematic diagram of a modified component for use in the circuit of FIG. 1.

FIG. 5 is a schematic diagram showing the invention in a generalized form.

DESCRIPTION OF THE PREFERRED EMBODIMENTS

Figure 1:
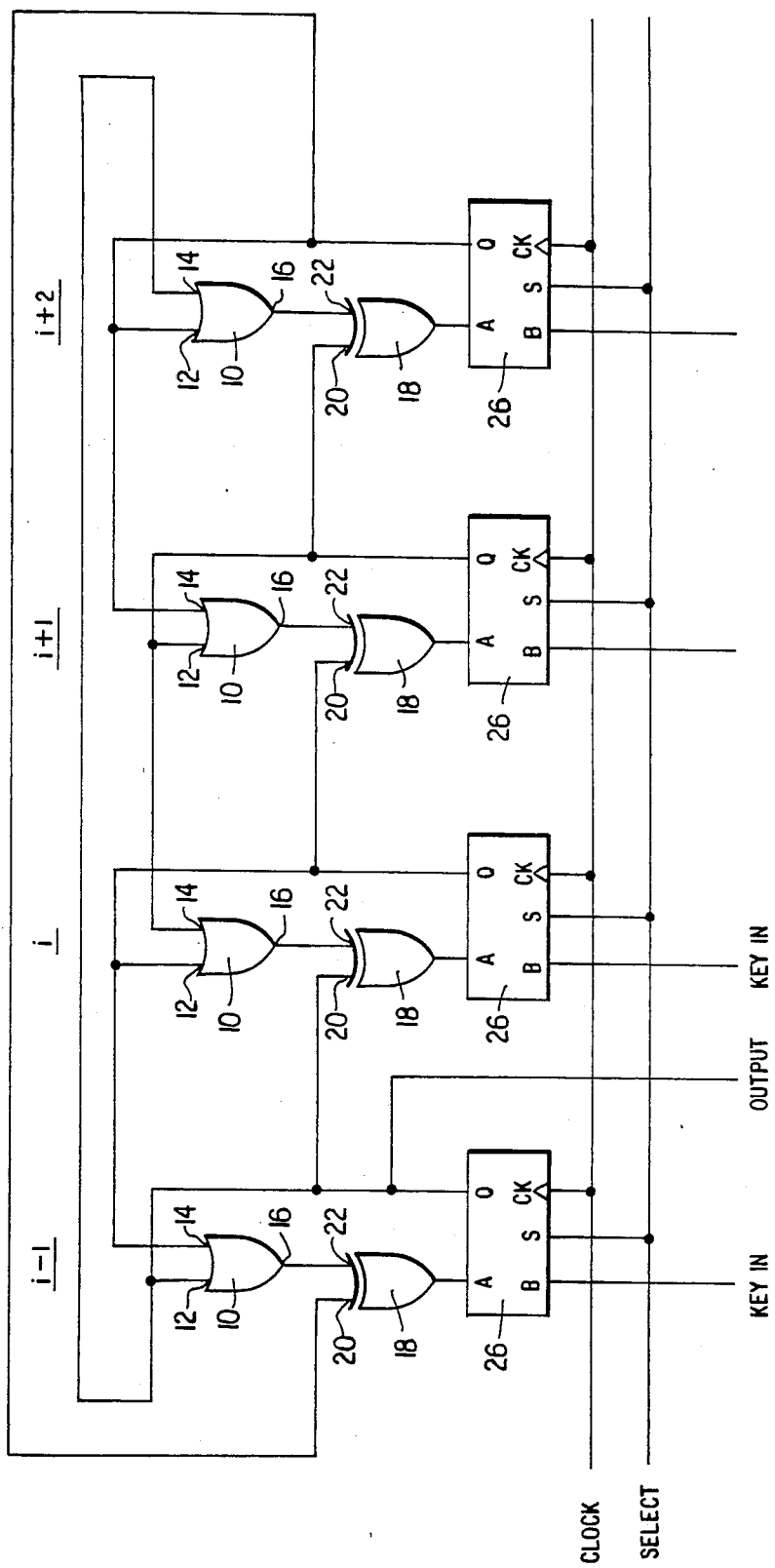
FIG. 1 is a schematic diagram of a preferred embodiment of the invention having four stages.

A specific embodiment of the invention employing four stages is shown in FIG. 1. It will be understood that, in practice, a larger number of stages (for example, 127) would be used and that only four stages have been illustrated to simplify the explanation. The four stages comprising the random sequence generator of FIG. 1 are designated from left to right as i−1, i, i+1 and i+2. The output can be taken from one or more of the identical stages, and in FIG. 1 is shown as being taken from only the i−1 stage.

Each of the stages includes an OR gate 10 having a first input 12, a second input 14 and an output 16; an exclusive OR gate 18 (XOR) having a first input 20, a second input 22 connected to the output 16 of the OR gate 10, and an output 24; and an input-output circuit 26 having a first input A connected to the output 24 of the XOR gate 18, a second input B for receiving a key input signal, a third input S for receiving a select pulse, a fourth input CK for receiving a stream of clock pulses, and an output Q. The function of the select pulse is to transfer the key input signal to the output Q during the next clock pulse.

The output Q of each input-output circuit 26 is connected to the first input 12 of the OR gate of its own stage, the second input 14 of the OR gate of the previous stage and the first input 20 of the XOR gate 18 of the next succeeding stage. In particular, referring to the i−1 stage of FIG. 1, the output Q of the input-output circuit 26 is connected to the first input 12 of the i−1 stage OR gate 10, the second input 14 of the i+2 stage OR gate 10 and to the first input 20 of the i stage XOR gate 18. The connections to each of the other stages are made in the same way.

The OR gates 10 and XOR gates 18 are conventional. Each OR gate produces a 1 at its output when a 1 is applied to one or both of its inputs; if both inputs are 0, its output is 0. Each XOR gate produces a 1 at its output when its inputs are different; if both inputs are 1 or both are 0, the output is 0.

Details of each of the input-output circuits 26 are illustrated in FIG. 2. As shown, each input-output circuit 26 comprises a two-input multiplexer 28 having inputs A, B and S, and an output Y. The input-output circuit 26 also comprises an edge-triggered D-type flip-flop 30 having an input D connected to the output Y of the multiplexer 28, a clock input CK and an output Q. The multiplexer 28 and flip-flop 30 are available commercially as types 74257 and 7474, respectively.

In operation, an arbitrarily defined key input signal, consisting of a series of 1's and 0's, is applied to the B inputs of all of the multiplexers 28 of the input-output circuits 26. Simultaneously, a select pulse is applied to the S input of each of the multiplexers. This causes the key input signal at terminal B to be connected directly to the D input of the corresponding flip-flop 30 through the output Y of the multiplexer 28. When the next clock signal is applied to the CK terminals of flip-flops 30, the key input signal appears at the output terminals Q of the flip-flops. The select pulse is not inputted again during the random signal generation cycle and thereafter the only input signals to multiplexers 28 are obtained from the outputs 24 of XOR gates 18.

Assume that at clock pulse 0, a key input signal 0100 is applied to circuits 26; that is, a 0 is applied to terminal B of the i−1 stage input-output circuit 26, a 1 to terminal B of the i stage, a 0 to terminal B of the i+1 stage and a 0 to terminal B of the i+2 stage, together with select pulses to each of the circuits 26. The following Table I shows the state of each terminal in the random sequence generator of FIG. 1 for the first three clock pulses following input of the key input signal 0100 at clock pulse 0.

TABLE 1

| Stage | Clock Pulse | OR Gate 10 | | | XOR Gate 18 | | | Input-Output 26 | |
|---|---|---|---|---|---|---|---|---|---|
| | | 12 | 14 | 16 | 20 | 22 | 24 | A | Q |
| i − 1 | 1 | 0 | 1 | 1 | 0 | 1 | 1 | 1 | 0 |
| i | 1 | 1 | 0 | 1 | 0 | 1 | 1 | 1 | 1 |
| i + 1 | 1 | 0 | 0 | 0 | 1 | 0 | 1 | 1 | 0 |
| i + 2 | 1 | 0 | 0 | 0 | 0 | 0 | 0 | 0 | 0 |
| i − 1 | 2 | 1 | 1 | 1 | 0 | 1 | 1 | 1 | 1 |
| i | 2 | 1 | 1 | 1 | 1 | 1 | 0 | 0 | 1 |
| i + 1 | 2 | 1 | 0 | 1 | 1 | 1 | 0 | 0 | 1 |
| i + 2 | 2 | 0 | 1 | 1 | 1 | 1 | 0 | 0 | 0 |
| i − 1 | 3 | 1 | 0 | 1 | 0 | 1 | 1 | 1 | 1 |
| i | 3 | 0 | 0 | 0 | 1 | 0 | 1 | 1 | 0 |
| i + 1 | 3 | 0 | 0 | 0 | 0 | 0 | 0 | 0 | 0 |
| i + 2 | 3 | 0 | 1 | 1 | 0 | 1 | 1 | 1 | 0 |

During clock pulse 1 the key input signal 0100, which was applied to the B terminals of the input-output circuits 26 during the previous clock pulse simultaneously with the application of a select pulse to the S inputs of the circuits 26, appears at the Q output terminals of the circuits 26. Thus, during clock pulse 1, the signal at the Q terminal of the i−1 stage is 0, at the Q terminal of the i stage 1, at the Q terminal of the i+1 stage 0 and at the Q terminal of the i+2 stage 0. This is shown in the last column of Table 1.

Referring to the output Q=1 of the i stage during clock pulse 1, by way of example, this means that input 12 of OR gate 10 of the i stage is a 1, input 14 of OR gate 10 of the i−1 stage is a 1 and input 20 of XOR gate 18 of the i+1 stage is a 1. Similarly, for the i−1 stage output Q=0, input 12 of OR gate 10 of the i−1 stage is 0, input 14 of OR gate 10 of the i+2 stage is zero and input 20 of the XOR gate 18 of the i stage is 0. The inputs 12 and 14 of the other OR gates 10, and the input 20 of the other XOR gates are obtained in the same way and shown in Table 1. Thus, at the end of the clock pulse 1 the inputs A to input-output circuits 26 in stages i−1, i, i+1 and i+2 are 0100 respectively, and this input becomes the output Q during the next cycle because of the one clock pulse delay in the flip-flop 30.

FIGS. 3a to 3k show the outputs Q for the first eleven outputs at the Q terminals following application of the key input signal 0100. It can be seen that the output at each clock pulse can be obtained by OR'ing the output with the output of the next stage to the right in FIG. 1, and then XOR'ing the result with the preceding stage to the left in FIG. 1. That is, if the output of the i stage is $a_i$, it is OR'd with the output $a_{i+1}$ of the i+1 stage, and the resultant signal XOR'd with the output $a_{i-1}$ of the i−1 stage.

When only four stages are used, the maximum number of different outputs which can be obtained before they begin to repeat is eight. Stated another way, the maximum cycle length (MCL) for four stages is eight, as indicated by the dashed line 32. If the number of stages is increased to 5, the maximum cycle length MCL is decreased to 5, with 6 stages the MCL is 1, with 7 stages, the MCL is 63 and with 8 stages, the MCL is 40. With 49 stages the MCL is probably 9,937,383,652 although there is some degree of uncertainty for values of N above 16. A typical number of stages for a practical cycle is N=127.

Study of Table II indicates that the maximum cycle length is roughly approximate to the value $2^{0.61N}$, where this expression is obtained by fitting a curve to the data. Probable MCL's for N equal to from 4 to 51 are shown in Table II.

TABLE II

| Number of Stage N | Probable Maximum Cycle Length (MCL) |
|---|---|
| 4 | 8 |
| 5 | 5 |
| 6 | 1 |
| 7 | 63 |
| 8 | 40 |
| 9 | 171 |
| 10 | 15 |
| 11 | 154 |
| 12 | 102 |
| 13 | 832 |
| 14 | 1428 |
| 15 | 1455 |
| 16 | 6016 |
| 17 | 10845 |
| 18 | 2844 |
| 19 | 3705 |
| 20 | 6150 |
| 21 | 2793 |
| 22 | 3256 |
| 23 | 38249 |

TABLE II-continued

| Number of Stage N | Probable Maximum Cycle Length (MCL) |
|---|---|
| 24 | 185040 |
| 25 | 588425 |
| 26 | 312156 |
| 27 | 67554 |
| 28 | 249165 |
| 29 | 1466066 |
| 30 | 306120 |
| 31 | 2841150 |
| 32 | 2002272 |
| 33 | 2038476 |
| 34 | 5656002 |
| 35 | 18480630 |
| 36 | 2844 |
| 37 | 49276415 |
| 38 | 9329228 |
| 39 | 961272 |
| 40 | 19211080 |
| 41 | 51151354 |
| 42 | 109603410 |
| 43 | 93537212 |
| 44 | 192218312 |
| 45 | 75864495 |
| 46 | 261598274 |
| 47 | 811284813 |
| 48 | 3035918676 |
| 49 | 9937383652 |
| 50 | 593487780 |
| 51 | 3625711023 |

It is found that the sequences have a high degree of randomness. No general method to predict their behavior is known, and it is suspected that the sequences are computationally irreducible so that no such method even in principle exist.

Table III shows the first 45 outputs obtained from a random signal generator having N=9 stages when the key input signal is 000010000, and Table IV shows the first 45 outputs obtained for N=9 stages when the key input signal is 001100101. As can be seen, the patterns are complex and produce random outputs without an external input of random conditions. As indicated in Table II, the maximum cycle length for N=9 is 171 outputs before the pattern begins to repeat.

TABLE III

```
0 0 0 0 1 0 0 0 0
0 0 0 1 1 1 0 0 0
0 0 1 1 0 0 1 0 0
0 1 1 0 1 1 1 1 0
1 1 0 0 1 0 0 0 1
0 0 1 1 1 1 0 1 1
1 1 1 0 0 0 0 1 0
1 0 0 1 0 0 1 1 0
1 1 1 1 1 1 1 0 0
1 0 0 0 0 0 0 1 1
0 1 0 0 0 0 1 1 0
1 1 1 0 0 1 1 0 1
0 0 0 1 1 1 0 0 1
1 0 1 1 0 0 1 1 1
0 0 1 0 1 1 1 0 0
0 1 1 0 1 0 0 1 0
1 1 0 0 1 1 1 1 1
0 0 1 1 1 0 0 0 0
0 1 1 0 0 1 0 0 0
1 1 0 1 1 1 1 0 0
1 0 0 1 0 0 0 1 1
0 1 1 1 1 0 1 1 0
1 1 0 0 0 0 1 0 1
0 0 1 0 0 1 1 0 1
1 1 1 1 1 1 0 0 1
0 0 0 0 0 0 1 1 1
1 0 0 0 0 1 1 0 0
1 1 0 0 1 1 0 1 1
0 0 1 1 1 0 0 1 0
```

TABLE III-continued

```
0 1 1 0 0 1 1 1 1
0 1 0 1 1 1 0 0 0
1 1 0 1 0 0 1 0 0
1 0 0 1 1 1 1 1 1
0 1 1 1 0 0 0 0 0
1 1 0 0 1 0 0 0 0
1 0 1 1 1 1 0 0 1
0 0 1 0 0 0 1 1 1
1 1 1 1 0 1 1 0 0
1 0 0 0 0 1 0 1 1
0 1 0 0 1 1 0 1 0
1 1 1 1 1 0 0 1 1
0 0 0 0 0 1 1 1 0
0 0 0 0 1 1 0 0 1
1 0 0 1 1 0 1 1 1
0 1 1 1 0 0 1 0 0
```

TABLE IV

```
0 0 1 1 0 0 1 0 1
1 1 1 0 1 1 1 0 1
0 0 0 0 1 0 0 0 1
1 0 0 1 1 1 0 1 1
0 1 1 1 0 0 0 1 0
1 1 0 0 1 0 1 1 1
0 0 1 1 1 0 1 0 0
0 1 1 0 0 0 1 1 0
1 1 0 1 0 1 1 0 1
0 0 0 1 0 1 0 0 1
1 0 1 1 0 1 1 1 1
0 0 1 0 0 1 0 0 0
0 1 1 1 1 1 1 0 0
1 1 0 0 0 0 0 1 0
1 0 1 0 0 0 0 1 0
1 0 1 1 0 1 1 0 0
1 0 1 0 0 1 0 1 1
0 0 1 1 1 1 0 1 0
0 1 1 0 0 0 0 1 1
0 1 0 1 0 0 1 1 0
1 1 0 1 1 1 1 0 1
0 0 0 1 0 0 0 0 1
1 0 1 1 1 0 0 1 1
0 0 1 0 0 1 1 1 0
0 1 1 1 1 1 0 0 1
0 1 0 0 0 0 1 1 1
0 1 1 0 0 1 1 0 0
1 1 0 1 1 1 0 1 0
1 0 0 1 0 0 0 1 0
1 1 1 1 1 0 1 1 0
1 0 0 0 0 0 0 1 0
1 1 0 0 0 1 1 1 1
0 0 1 0 1 1 0 0 0
0 1 1 0 1 0 1 0 0
1 1 0 0 1 0 1 1 0
1 0 1 1 1 0 1 0 0
1 0 1 0 0 0 1 1 1
0 0 1 1 0 1 1 0 0
0 1 1 0 0 1 0 1 0
1 1 0 1 1 1 0 1 1
0 0 0 1 0 0 0 1 0
0 0 1 1 1 0 1 1 1
1 1 1 0 0 0 1 0 0
1 0 0 1 0 1 1 1 1
0 1 1 1 0 1 0 0 0
```

The circuit of FIG. 1 can be modified to implement the rule $$a_i' = a_{i-1} \text{ XOR } (a_i \text{ OR } (\text{NOT } a_{i+1})) \quad (3)$$

by substituting an OR gate 10a of FIG. 4 for each of the OR gates of FIG. 1. OR gate 10a differs from OR gate 10 only in that the second input 14a is inverted. Accordingly, the output 16 is a 1 when input 12 is a 1 or input 14a is a 0.

FIG. 5 shows a more generalized form of the invention which comprises a plurality of stages, each of which includes a logic circuit 50 and an input-output circuit 26 of the type described previously. It shall be understood that in order to avoid complicating the diagram only the connections to the i stage are shown and only seven stages have been illustrated. The line of dots at the left and right of the figure indicate that the stages are connected in a closed loop, as in the embodiment of FIG. 1, and each of the stages is connected to its previous and succeeding stages in exactly the same way as the i stage is connected to its previous and succeeding stages.

The circuit of FIG. 5 can be described by selecting r equal to 2 in Rule (1), which results in the expression:

$$a_i' = 0 \, (a_{i-2}, a_{i-1}, a_i, a_{i+1}, a_{i+2}). \quad (4)$$

Each logic circuit has $n = 2r + 1 = 5$ inputs, one of which is connected to the output Q of its own input-output circuit 26 and the remaining $n - 1$ inputs to the outputs of the immediately previous r stages and to the immediately succeeding r stages. More specifically, referring to the i stage of FIG. 5, the center input to logic circuit 50 is connected to the output Q of the input-output circuit of the i stage, the two left hand inputs to the outputs Q of the input-output circuits 26 of the $i-2$ and $i-1$ stages and the two right hand inputs to the outputs Q of the input-output circuits 26 of the $i+1$ and $i+2$ stages. Similarly, it shall be understood that the inputs to the logic circuit 50 of the $i-1$ stage are connected to the outputs Q of the $i-3$, $i-2$, $i-1$, $i$ and $i+1$ stages, and that the inputs to the logic circuit 50 of the $i-3$ stage would be connected to the outputs Q of the $i+2$, $i+3$, $i-3$, $i-2$ and $i-1$ stages. The other stages are all connected in exactly the same way.

While FIG. 5 illustrates an embodiment wherein the input of each logic circuit is connected only to its own output and those of immediately previous and succeeding stages, it would be possible to connect the logic circuit inputs to the outputs of stages which are not immediately previous or succeeding, with some increase in the complexity of the generator.

The logic circuit 50 may consist of a type 2102 storage element or look-up table which has a specific output, either a 0 or 1, depending on the combination of 0's and 1's applied to its inputs. Thus, a look-up table suitable for use as logic circuit 50 would have $2^5$ addresses corresponding to its 32 possible inputs, and each input would generate a 0 or 1 at the output depending on how the table was programmed.

It is apparent that the circuit of FIG. 1 is a special case of that shown in FIG. 5. In FIG. 1, the logic circuit of each stage corresponding to element 50 of FIG. 5 consists of an OR gate 10 and an XOR gate 18. Since $r = 1$ for the circuit of FIG. 1, the total number of inputs to the OR and XOR gates is $2r + 1 = 3$. These inputs are 12 and 14 to OR gate 10, and 20 to the XOR gate 18. Thus, referring to the i stage of FIG. 1, input 12 of OR gate 10 of the i stage is connected to output Q of the i stage input-output circuit 26, input 14 of OR gate 10 to the output Q of the $i+1$ stage and input 20 of OR gate 18 to the output Q of the $i-1$ stage.

It will be understood that the above description of the present invention is susceptible to various modifications, changes and adaptations, and the same are intended to be comprehended within the meaning and range of equivalents of the appended claims.

What is claimed is:

1. A random sequence generator, comprising a plurality of successive stages arranged in a closed loop wherein each of said stages includes a logic circuit having n inputs and an output, said logic circuit having $2^n$ addresses for generating a 0 or 1 at its output in accordance with the signal applied to its n inputs;

an input-output circuit having a first input connected to the output of said logic circuit, a second input and an output; and connection means connecting one of the inputs of said logic circuit to the output of the input-output circuit of the same stage, another input of said logic circuit to the output of the input-output circuit of a preceding stage and still another input of said logic circuit to the output of the input-output circuit of a succeeding stage, an output signal having a plurality of sequential random values being generated at the output of each of said input-output circuits in response to an initial key signal applied to the second inputs of said input-output means.

2. A random sequence generator as defined by claim 1 wherein the inputs of said logic circuit other than said one input are connected to corresponding outputs of the immediately previous r stages and the immediately succeeding r stages, where $r=(n-1)/2$.

3. A randum sequence generator as defined by claim 1 wherein each of said logic circuits comprises an OR gate and an exclusive OR gate, said exclusive OR gate having an input connected to the output of said OR gate and an output connected to the first input of said input-output circuit, said n inputs to said logic circuit including first and second inputs to said OR gate and a third input to said exclusive OR gate.

4. A random sequence generator as defined in claim 2 wherein each of said logic circuits comprises an OR gate and an exclusive OR gate, said exclusive OR gate having an input connected to the output of said OR gate and an output connected to the first input of said input-output circuit, said n inputs to said logic circuit including first and second inputs to said OR gate and a third input to said exclusive OR gate, the number of input n to the logic circuit being 3 and r being equal to one.

5. A random sequence generator, comprising a plurality of successive stages arranged in a closed loop wherein each of said stages includes an OR gate having a first input, a second input and an output;

an exclusive OR gate having a first input, a second input connected to the output of said OR gate and an output; and an input-output circuit having a first input connected to the output of said exclusive OR gate, a second input and an output; and connection means connecting the outputs of each of said input-output circuits to the first input of the OR gate of the same stage, to the second input of the OR gate of the previous stage and to the first input of the exclusive OR gate of the succeeding stage, an output signal having a plurality of sequential random values being generated at the output of each of said input-output circuits in response to an initial key signal applied to the second inputs thereof.

6. A random sequence generator as defined by claim 5 wherein each of said input-output circuits comprises a multiplexer having a first input, a second input and an output; and a flip-flop having an input connected to the output of said multiplexer, an output, and means for receiving sequential clock pulses, said flip-flop generating at its output a signal having a value corresponding to the value of the signal applied to its input during receipt of the previous clock pulse, the first and second inputs of said multiplexer corresponding to the first and second inputs of said input-output circuit and the output of said flip-flop corresponding to the output of said input-output circuit.

7. A random sequence generator as defined by claim 5 wherein the signal at the second input of the OR gate of each of said stages is inverted.

8. A random sequence generator as defined by claim 7 wherein each of said input-output circuits comprises . a multiplexer having a first input, a second input and an output; and a flip-flop having an input connected to the output of said multiplexer, an output, and means for receiving sequential clock pulses, said flip-flop generating at its output a signal having a value corresponding to the value of the signal applied to its input during receipt of the previous clock pulse, the first and second inputs of said multiplexer corresponding to the first and second inputs of said input-output circuit and the output of said flip-flop corresponding to the output of said input-output circuit.

9. A method of generating random sequence signals from a plurality of successive stages arranged in a closed loop wherein each of said stages includes a logic circuit having n inputs and an output, said method comprising the steps of applying a key input signal to each of said stages;

transferring said key input signal to the output of its corresponding stage; and applying the output of each of said stages to an input of the logic circuit of the same stage and to the inputs of the logic circuits of 2r other of said stages, where $r=(n-1)/2$, the signals appearing at the outputs of each of said stages being a random sequence having a length determined by the number of stages in the generator and by the key input signal.

10. The method defined by claim 9 wherein the output of each stage is applied to the input of the logic circuit of the same stage and to the inputs of the logic circuits of only the 2r immediately previous and succeeding stages.

11. A method of generating random sequence signals from a plurality of successive stages arranged in a closed loop wherein each of said stages includes an OR gate and an XOR gate and means for generating an output, said method comprising the steps of applying a key input signal to each of said stages;

transferring said key input signal to the output of its corresponding stage;

applying the output of each of said stages to a first input of the OR gate of the same stage, a second input of the OR gate of the previous stage and to a first input of the XOR gate of the succeeding stage;

applying the output of the OR gate of each stage to a second input of the XOR gate of the same stage; and transferring the output of each XOR gate to the output of its own stage, the signals appearing at the outputs of each of said stages being a random sequence having a length determined by the number of stages in the generator and by the key input signal.

* * * * *